United States Patent
Lee et al.

(10) Patent No.: US 8,987,118 B2
(45) Date of Patent: Mar. 24, 2015

(54) METHOD OF FABRICATING SEMICONDUCTOR DEVICE

(71) Applicants: Samsung Electronics Co., Ltd., Suwon-si (KR); Fujifilm Corporation, Tokyo (JP)

(72) Inventors: Hyung-Rae Lee, Hwaseong-si (KR); Keita Kato, Shizuoka (JP); Atsushi Nakamura, Shizuoka (JP); Yool Kang, Yongin-si (KR); Suk-Koo Hong, Seongnam-si (KR); Jae-Ho Kim, Yongin-si (KR); Dong-Jun Lee, Seoul (KR); Si-Young Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/017,833

(22) Filed: Sep. 4, 2013

(65) Prior Publication Data

US 2014/0124834 A1  May 8, 2014

(30) Foreign Application Priority Data

Nov. 7, 2012 (KR) .................. 10-2012-0125596

(51) Int. Cl.
*H01L 21/20* (2006.01)
*H01L 29/78* (2006.01)
(Continued)

(52) U.S. Cl.
CPC ...... *H01L 29/7848* (2013.01); *H01L 29/66636* (2013.01); *H01L 21/0274* (2013.01);
(Continued)

(58) Field of Classification Search
CPC .................. H01L 21/0274; H01L 21/823814; H01L 21/823878; H01L 21/3083; H01L 21/823807; H01L 29/66636; H01L 29/7848; H01L 29/165; G03F 7/0045; G03F 7/0046; G03F 7/0397; G03F 7/405; G01F 7/325
USPC ............. 257/288, 77, 334, 190; 438/147, 46, 438/429, 478

See application file for complete search history.

(56) References Cited

U.S. PATENT DOCUMENTS 4,933,303 A   6/1990  Mo
5,306,390 A   4/1994  Peek
(Continued)

FOREIGN PATENT DOCUMENTS

JP   05036599   2/1993
JP   06084786   3/1994
(Continued)

OTHER PUBLICATIONS

Wolf et al., "Silicon Processing for VLSI Era", 2000, Lattice Press, p. 489.*

*Primary Examiner* — Nikolay Yushin
(74) *Attorney, Agent, or Firm* — Onello & Mello, LLP.

(57) ABSTRACT

A method of fabricating a semiconductor device is disclosed comprising the steps of: providing a substrate having a first region, a second region and a plurality of gate electrodes which are formed on the first and second regions of the substrate; forming a mask film to expose the first region of the substrate while covering the second region of the substrate, such that the mask film has a negative lateral profile at a boundary between the first and second regions of the substrate; forming sigma trenches in the first region of the substrate by etching the first region of the substrate using the mask film and the gate electrodes as a mask; and forming an epitaxial layer in each of the sigma trenches.

16 Claims, 6 Drawing Sheets

(51) Int. Cl.
*H01L 29/66* (2006.01)
*H01L 21/027* (2006.01)
*H01L 21/8238* (2006.01)
*H01L 21/308* (2006.01)
*G03F 7/004* (2006.01)
*G03F 7/039* (2006.01)
*G03F 7/32* (2006.01)
*G03F 7/40* (2006.01)
*H01L 29/165* (2006.01)

(52) U.S. Cl.
CPC *H01L21/823807* (2013.01); *H01L 21/823814* (2013.01); *H01L 21/823878* (2013.01); *H01L 21/3083* (2013.01); *G03F 7/0045* (2013.01); *G03F 7/0046* (2013.01); *G03F 7/0397* (2013.01); *G03F 7/325* (2013.01); *G03F 7/405* (2013.01); *H01L 29/165* (2013.01)
USPC .......................................................... 438/478

(56) References Cited

U.S. PATENT DOCUMENTS

| | | | |
|---|---|---|---|
| 6,358,856 | B1 | 3/2002 | Lyons et al. |
| 7,605,069 | B2 | 10/2009 | Jung et al. |
| 7,682,516 | B2 * | 3/2010 | Sadjadi et al. ................. 216/41 |
| 7,838,372 | B2 | 11/2010 | Han et al. |
| 8,604,550 | B2 * | 12/2013 | Lee et al. ...................... 257/368 |
| 2007/0075038 | A1 * | 4/2007 | Sadjadi et al. ................. 216/67 |
| 2011/0284968 | A1 * | 11/2011 | Lee et al. ...................... 257/368 |

FOREIGN PATENT DOCUMENTS

| KR | 1019990041569 | 6/1999 |
|---|---|---|
| KR | 1020080088923 | 10/2008 |
| KR | 2020110060724 | 6/2011 |

* cited by examiner

METHOD OF FABRICATING SEMICONDUCTOR DEVICE

This application claims priority from Korean Patent Application No. 10-2012-0125596 filed on Nov. 7, 2012 in the Korean Intellectual Property Office, the disclosure of which is incorporated herein by reference in its entirety.

BACKGROUND

1. Field of the Invention

The present invention relates generally to a method of fabricating a semiconductor device.

2. Description of the Related Art

In the fabrication of a highly integrated semiconductor device, the performance of the device can be improved by increasing the mobility of carriers within a channel of the semiconductor device. Accordingly, recent research in this field has focused on increasing carrier mobility. A method of increasing carrier mobility is to form a stress layer in a semiconductor device in order to apply tensile or compressive stress to a channel region.

However, as semiconductor devices have become smaller, element patterns of these devices have also become finer. The smaller sizes of these devices and the finer element patterns have made it increasingly difficult to form a stress layer in the process of fabricating a semiconductor device.

SUMMARY

Aspects of the present invention generally provide methods of fabricating a semiconductor device, in which a stress layer can reliably be formed in the process of fabricating a semiconductor device.

However, the present invention is not restricted to the invention aspects described herein. These and other aspects of the present invention will become more apparent to one of ordinary skill in the art to which the present invention pertains by referencing the detailed description of the present invention given below, read in conjunction with the accompanying drawings.

According to an aspect of the present invention, there is provided a method of fabricating a semiconductor device, the method comprising: providing a substrate which comprises a first region, a second region and a plurality of gate electrodes which are formed on the first and second regions of the substrate; forming a mask film so as to expose the first region of the substrate and cover the second region of the substrate, while also having a negative lateral profile at a boundary between the first and second regions of the substrate; forming sigma trenches in the first region of the substrate by etching the first region of the substrate using the combination of the mask film and the first region gate electrodes as a mask; and forming an epitaxial layer in each of the sigma trenches.

According to another aspect of the present invention, there is provided a method of fabricating a semiconductor device, the method comprising: providing a substrate which comprises a first region, a second region and a plurality of gate electrodes which are formed on the first and second regions of the substrate; forming a positive resist film on the first and second regions of the substrate; irradiating light to the portion of the positive resist film formed on the second region of the substrate; exposing the first region of the substrate by applying a negative developing solution to the portion of the positive resist film formed on the first region of the substrate; forming sigma trenches in the first region of the substrate by etching the first region of the substrate using the combination of the positive resist film and the first region gate electrodes as a mask; and forming an epitaxial layer in each of the sigma trenches.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1:
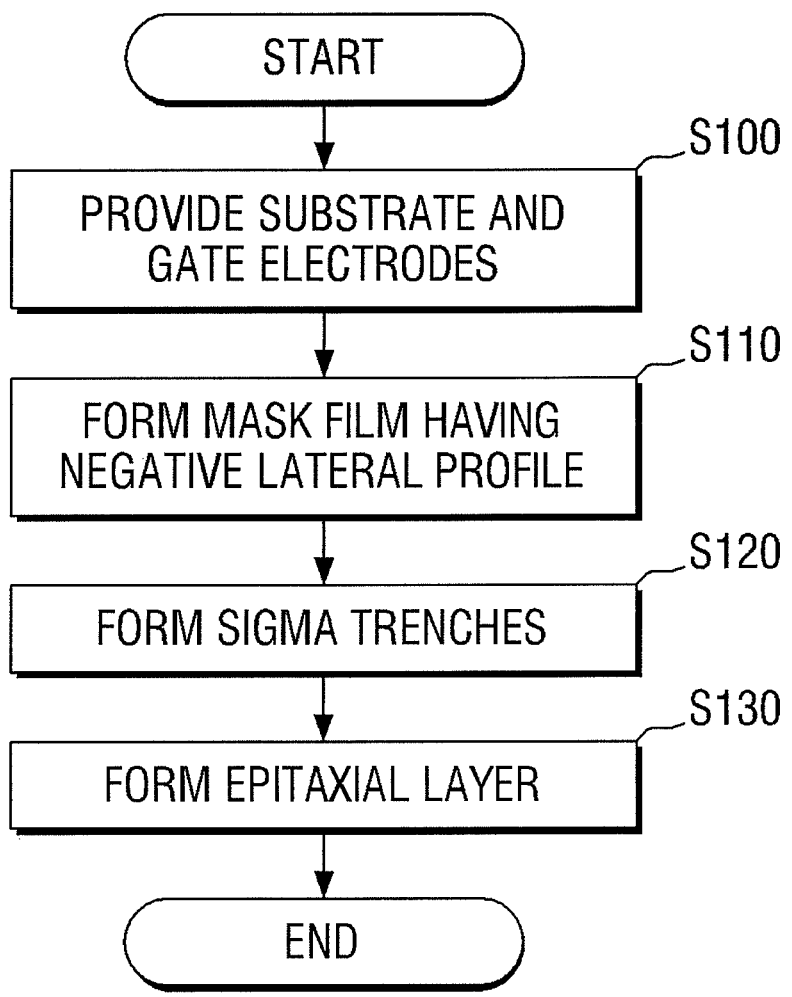
FIG. 1 is a flowchart illustrating a method of fabricating a semiconductor device according to embodiments of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept and scope of the invention to those skilled in the art. The present invention will further be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

The present invention will be described with reference to schematic perspective views, cross-sectional views, and/or plan views, in which preferred embodiments of the invention are shown. But, it should be understood that the profile of an exemplary view may be modified according to manufacturing techniques and/or allowances. That is, the illustrated embodiments of the invention are not intended to limit the scope of the present invention; but rather, this application and the accompanying claims should be construed to cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this invention belongs. It is noted that the use of any and all examples, or exemplary terms provided herein, is intended merely to better illuminate the invention and is not a limitation on the scope of the invention unless otherwise specified. Further, unless defined otherwise, all terms defined in generally used dictionaries are intended to be interpreted consistent with such common dictionary definitions.

Hereinafter, a method of fabricating a semiconductor device according to embodiments of the present invention will be described with reference to FIGS. 1 through 9.

FIG. 1 is a flowchart illustrating a method of fabricating a semiconductor device according to embodiments of the present invention. FIGS. 2 through 9 are schematic illustrations of a semiconductor device at intermediate steps in a method of fabricating a semiconductor device according to embodiments of the present invention. In particular, FIGS. 3 through 9 are schematic cross-sectional views taken along the lines P-P' and Q-Q' of FIG. 2.

Referring to FIG. 1, a substrate and gate electrodes are provided (operation S100). Specifically, a substrate including a first region and a second region is provided, and a plurality of gate electrodes is formed on each of the first and second regions of the substrate.

Figure 2:
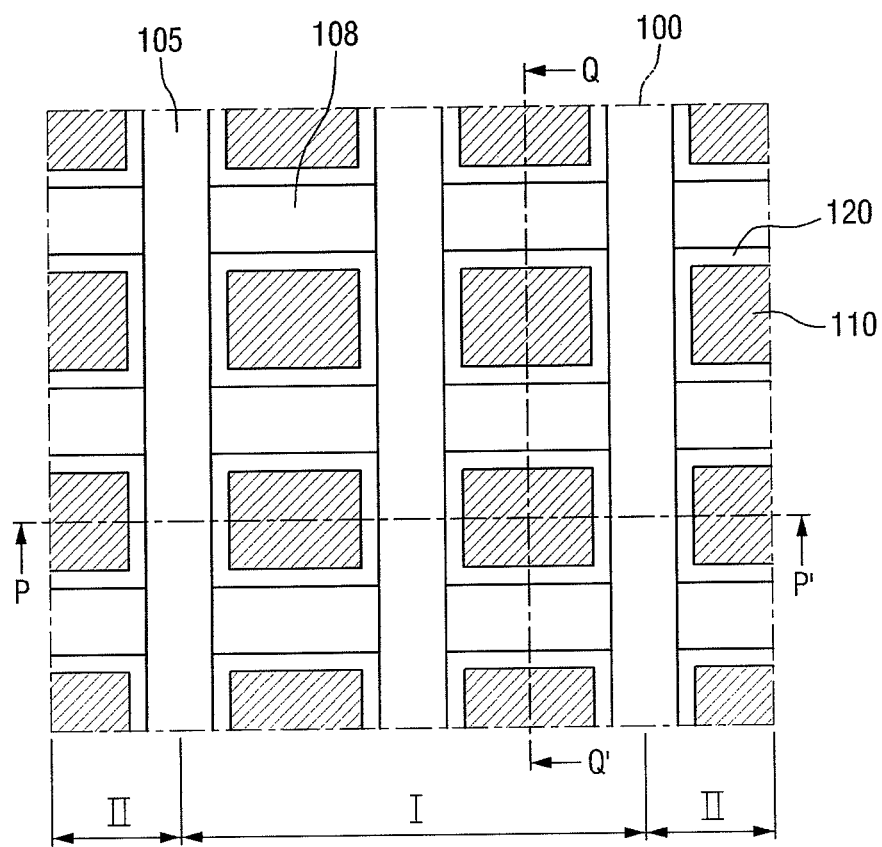
FIGS. 2 through 9 are schematic illustrations of a semiconductor device at intermediate steps in a method of fabricating a semiconductor device according to embodiments of the present invention.
Figure 3:
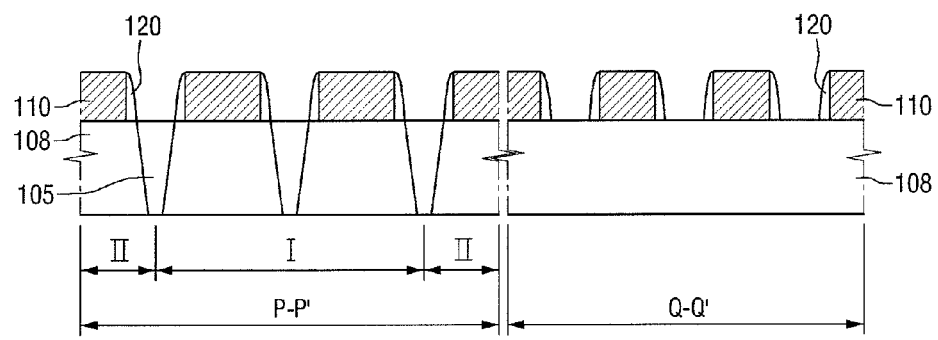

More specifically, referring to FIGS. 2 and 3, a substrate 100 may include a first region I and a second region II. For example, the first region I of the substrate 100 may be a PMOS region in which a PMOS element is formed, and the second region II may be an NMOS region in which an NMOS element is formed.

An element isolation film 105 may be formed in the substrate 100 and extend in a first direction (e.g., a Y-axis direction). An active region 108 may also be formed in the substrate 100 and may also extend in the first direction (e.g., the Y-axis direction), that is parallel to the element isolation film 105. As shown in the drawings, the element isolation film 105 and the active region 108 may extend in the first direction (e.g., the Y-axis direction) and may be arranged alternately in a second direction (e.g., an X-axis direction).

Although a top surface of the element isolation film 105 is shown in FIG. 3 at the same height as a top surface of the substrate 100, the present invention is not limited thereto. When necessary, the top surface of the element isolation film 105 may be formed higher or lower than the top surface of the substrate 100.

A plurality of gate electrodes 110 may be formed on the active region 108. The gate electrodes 110 may be separated from each other in the first direction (e.g., the Y-axis direction), and they may also be separated from each other with the element isolation film 105 interposed therebetween in the second direction (e.g., the X-axis direction).

A gate spacer 120 may be formed on side surfaces of each of the gate electrodes 110. As shown in the drawings, the gate spacer 120 may be formed on both sidewalls of each of the gate electrodes 110. However, the shape of the gate spacer 120 is not limited to the shape illustrated in the drawings. That is, the gate spacer 120 can be formed in an 'L' shape, or a reverse 'L' shape, or can be omitted when necessary.

Referring back to FIG. 1, in the next part of the fabrication method, a mask film having a negative lateral profile is formed (operation S110). Specifically, a mask film having a negative lateral profile at a boundary between the first region and the second region of the substrate may be formed so as to expose the first region of the substrate and to cover the second region of the substrate.

The steps of forming the mask film will now be described in greater detail with reference to FIGS. 4 through 6.

Figure 4:
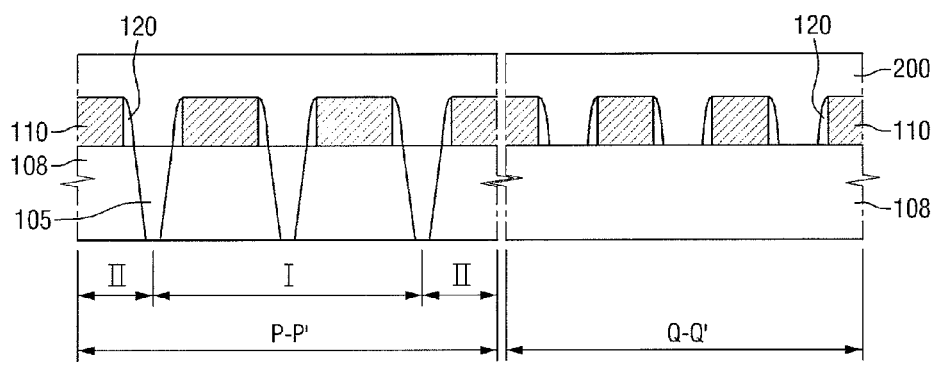

Referring to FIG. 4, a resist film 200 is formed on the first region I and the second region II of the substrate 100. In current invention embodiments, the resist film 200 may be a positive resist film in which a region exposed to light becomes soluble in a positive developing solution. In particular, in current embodiments, the resist film 200 may advantageously include a resist composition which contains both a polymer A and a compound B, as defined below.

Specifically, the polymer A may include a first repeating unit a represented by formula (1a) or formula (1b) below, and also a second repeating unit b represented by formula (2) below; but, polymer A may not include a repeating unit which contains an alcoholic hydroxyl group.

(1)

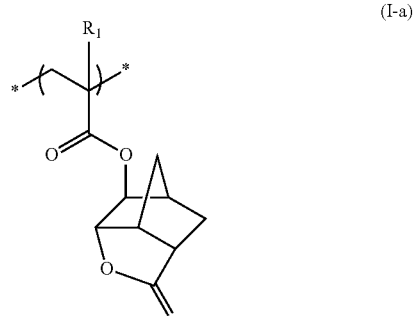

(I-a)

(I-b)

In formulas (1a) and (1b) above: $R_1$ is a hydrogen atom or an alkyl group with 1 to 10 carbons; $R_2$ is independently selected from an alkyl group with 1 to 10 carbons (when q is 2 or more); $R_3$ is a hydrogen atom or an alkyl group with 1 to 10 carbons; q is an integer of 0 to 3; and s is an integer of 1 to 3; and further wherein the alkyl group with 1 to 10 carbons as defined above may be a methyl group with 1 to 10 carbons.

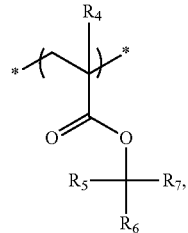

(II)

In formula (2) above: $R_4$ is a hydrogen atom or an alkyl group with 1 to 10 carbons; each of $R_5$, $R_6$ and $R_7$ is independently selected from an alkyl group with 1 to 10 carbons or a monocyclic cycloalkyl group with 6 to 20 carbons, further wherein two of $R_5$, $R_6$ and $R_7$ may combine to form a monocyclic ring; and further wherein the alkyl group with 1 to 10 carbons as defined above may be a methyl group with 1 to 10 carbons.

In some embodiments of the present invention, the polymer A may further include a third repeating unit c, which is different from the second repeating unit b, and which has a functional group that can be decomposed by the action of an acid.

The third repeating unit c can be represented by formula (4) below:

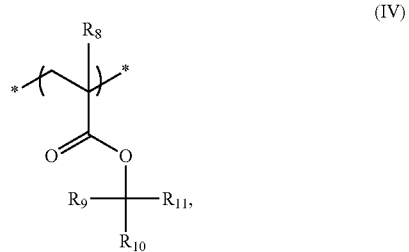

(IV)

In formula (4) above: $R_8$ is a hydrogen atom or an alkyl group with 1 to 10 carbons; each of $R_9$, $R_{10}$ and $R_{11}$ is independently selected from an alkyl group with 1 to 10 carbons or a cycloalkyl group with 3 to 15 carbons; further wherein at least one of $R_9$, $R_{10}$ and $R_{11}$ is a polycyclic cycloalkyl group, and also wherein two of $R_9$, $R_{10}$ and $R_{11}$ may combine to form a polycyclic hydrocarbon structure; and further wherein the alkyl group with 1 to 10 carbons as defined above may be a methyl group with 1 to 10 carbons.

In some embodiments of the present invention, the polymer A may include about 30 to 55 mole % of the first repeating unit a, about 30 to 65 mole % of the second repeating unit b, and about 5 to 30 mole % of the third repeating unit c. In some embodiments of the present invention, the number average molecular weight of the polymer A may be about 5000 to 30000.

The compound B can be represented by formula (3a) or formula (3b) below:

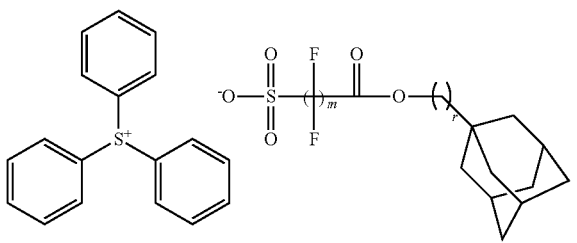

(III-a)

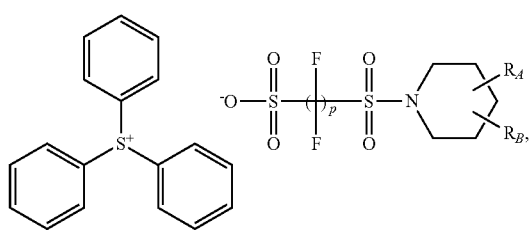

(III-b)

In formulas (3a) and (3b) above: m is an integer of 1 to 5; r is an integer of 0 to 3; each of $R_A$ and $R_B$ is independently selected from an alkyl group with 1 to 10 carbons, or $R_A$ and $R_B$ may combine to form a ring; and P is an integer of 1 to 5; wherein the alkyl group with 1 to 10 carbons as defined above may be a methyl group with 1 to 10 carbons.

In some embodiments of the present invention, the resist film 200 may further include a compound that can generate a compound of formula (5) below when exposed to actinic rays or radiation:

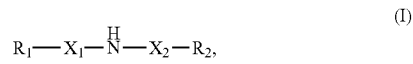

(I)

In formula (5) above: each of $R_1$ and $R_2$ is independently selected from a monovalent organic functional group, wherein at least one of $R_1$ and $R_2$ is a proton acceptor functional group, and also $R_1$ and $R_2$ may combine to form a ring wherein the ring may have a proton acceptor functional group; and each of $X_1$ and $X_2$ is independently selected from —CO— or —$SO_2$—.

Figure 5:
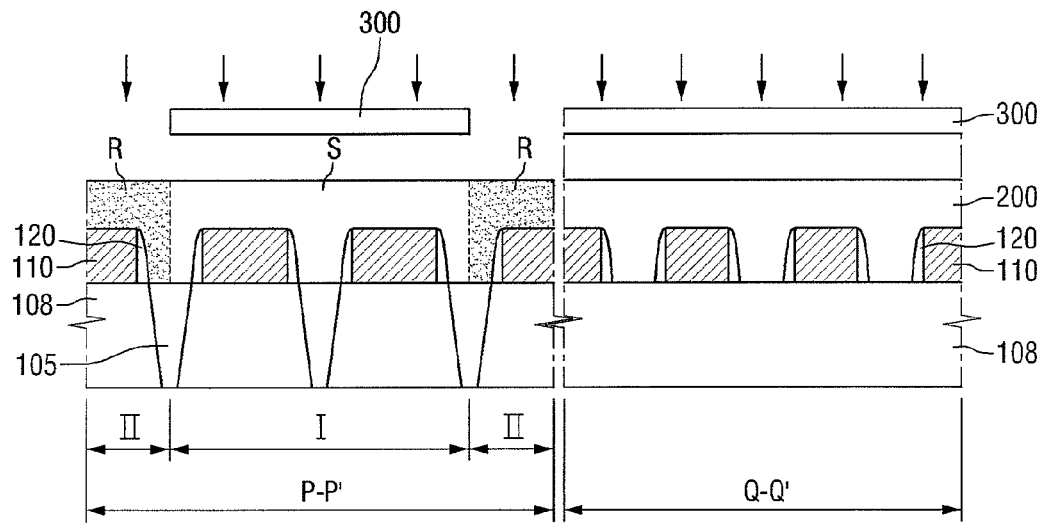

Referring to FIG. 5, light is irradiated to only the portion of the resist film 200 formed on the second region II of the substrate 100. Specifically, the first region I of the substrate 100 is shielded by a light-blocking pattern 300, thereby preventing light from reaching the resist film 200 formed on the first region I of the substrate 100. On the other hand, the second region II of the substrate 100 is not shielded by the light-blocking pattern 300, thereby exposing the resist film 200 formed on the second region II of the substrate 100 to light.

In this exposure process, light causes a chemical action in a resist film region R disposed on the second region II of the substrate 100. As a result of this light-initiated chemical action, the resist film region R becomes soluble in a positive developing solution, but is insoluble in a negative developing solution. On the other hand, a light-shielded resist film region S disposed on the first region I of the substrate 100 is insoluble in the positive developing solution, but is soluble in the negative developing solution.

Figure 6:
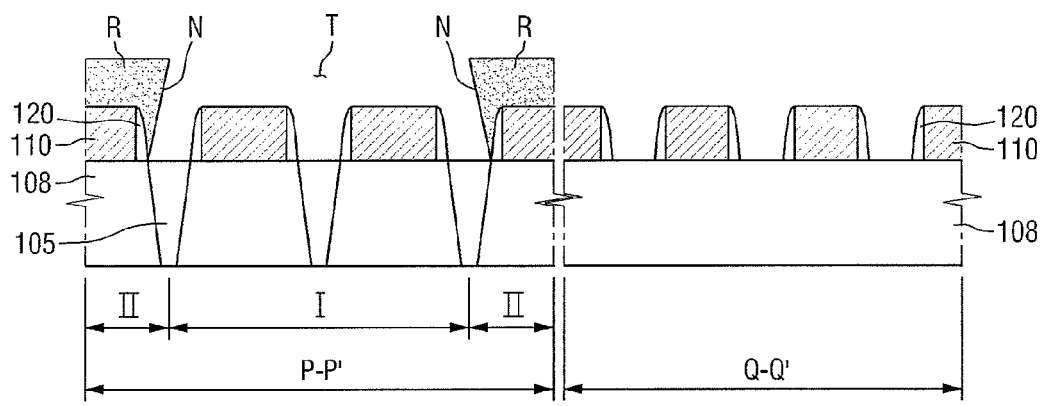

Referring to FIG. 6, a developing solution is applied to the resist film 200. In the current embodiments, the developing solution may be a negative developing solution. Examples of the negative developing solution may include, but are not limited to, a ketone-based solvent, an ester-based solvent, an alcohol-based solvent, an amide-based solvent, and an ether-based solvent.

Accordingly, if the negative developing solution is applied to the resist film 200 following the light irradiation explained above in connection with FIG. 5, the resist film region R disposed on the second region II of the substrate 100 may remain unremoved since it is insoluble in the negative developing solution. On the other hand, the resist film region S disposed on the first region I of the substrate 100 may be removed since it is soluble in the negative developing solution. The removal of the resist film region S disposed on the first region I of the substrate 100 exposes the first region I of the substrate 100 and those gate electrodes which are formed on the first region I. (Note: the reference numeral 110 is used in the drawings to identify the gate electrodes whether they are on region I or region II of the substrate.)

The resist film region R that remains after the treatment with the negative developing solution constitutes a mask film. In particular, in the current embodiments, this mask film (i.e., the remaining resist film region R) may have a negative lateral profile N at a boundary between the first region I and the second region II of the substrate 100, as shown in FIG. 6 (operation S110 in FIG. 1). That is, the first region I of the substrate 100 may be exposed such that a width of an aperture T between adjacent gate electrodes is reduced at a boundary between the first and second regions as the distance from the substrate 100 increases because of the negative lateral profile N of the mask film. As used herein, the term "negative lateral profile" is intended to refer to a mask shape or profile on a semiconductor device that has the configuration N as depicted in FIG. 6 and as explained above. As will be described in greater detail, this negative lateral profile of the mask film may facilitate a process of forming sigma trenches 140 (see FIG. 8) between the gate electrodes 110.

In some embodiments of the present invention, after the step of applying the developing solution to remove the resist film region S, optionally the substrate 100 may be cleaned using a cleaning solution which has a different composition from the developing solution. Examples of the cleaning solution may include, but are not limited to, a hydrocarbon-based solvent, a ketone-based solvent, an ester-based solvent, an alcohol-based solvent, and an ether-based solvent.

Referring back to FIG. 1, in the next fabrication steps sigma trenches are formed (operation S120). Specifically, the first region I of the substrate is etched using the mask film and the gate electrodes as a mask, thereby forming sigma trenches in the first region I of the substrate.

The particular steps of forming of the sigma trenches will now be described in greater detail with reference to FIGS. 7 and 8.

Figure 7:
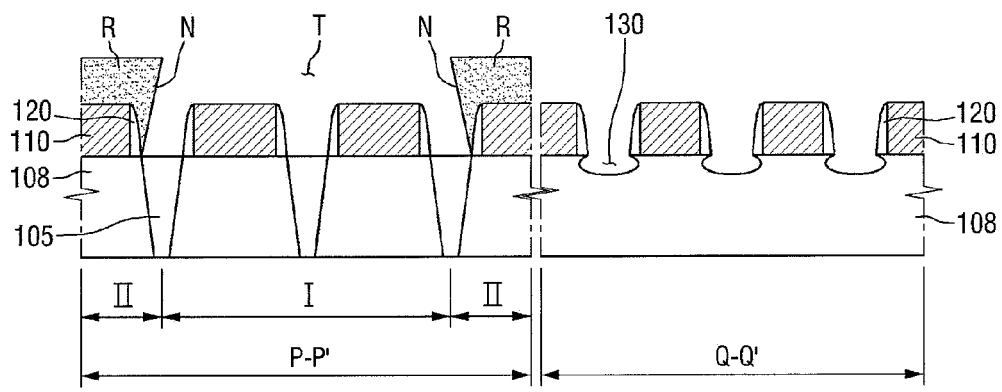

Referring to FIG. 7, the first region I of the substrate 100 is dry-etched using the mask film (i.e., the remaining resist film region R) and the gate electrodes 110 as a mask. As a result of the dry etching process, ball trenches 130 may be formed in exposed portions of the active region 108 in the first region I of the substrate 100. Because the gate electrodes act as a mask during this dry-etching step, the ball trenches 130 may be separated from each other by the gate electrodes 110 interposed therebetween in the first direction (e.g., a Y-axis direction in FIG. 2).

Figure 8:
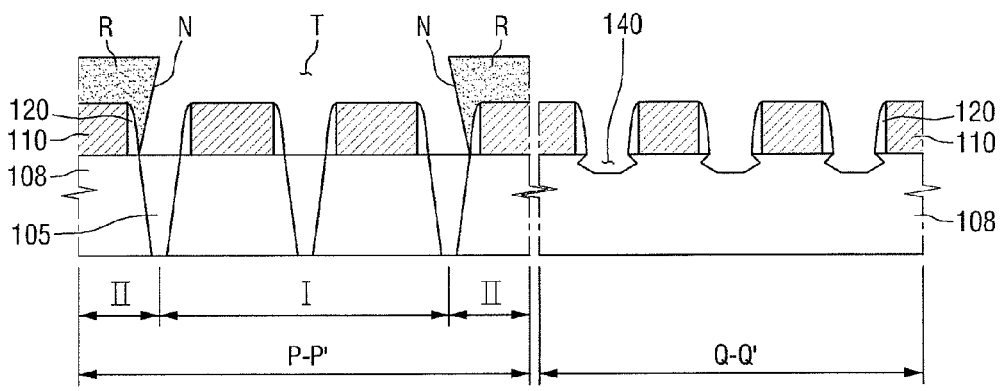

Referring to FIG. 8, in the next step the first region I of the substrate 100 is wet-etched using the mask film (i.e., the remaining resist film region R) and the gate electrodes 110 as a mask. The wet etching process etches the exposed ball trenches 130 (see FIG. 7) of the active region 108 in the first region I of the substrate 100. As a result, sigma trenches 140 are formed as shown in the drawing. Like the ball trenches 130, the sigma trenches 140 may be separated from each other by the gate electrodes 110 interposed therebetween in the first direction (e.g., the Y-axis direction in FIG. 2).

Referring back to FIG. 1, next an epitaxial layer is formed in each of the sigma trenches (operation S130).

Figure 9:
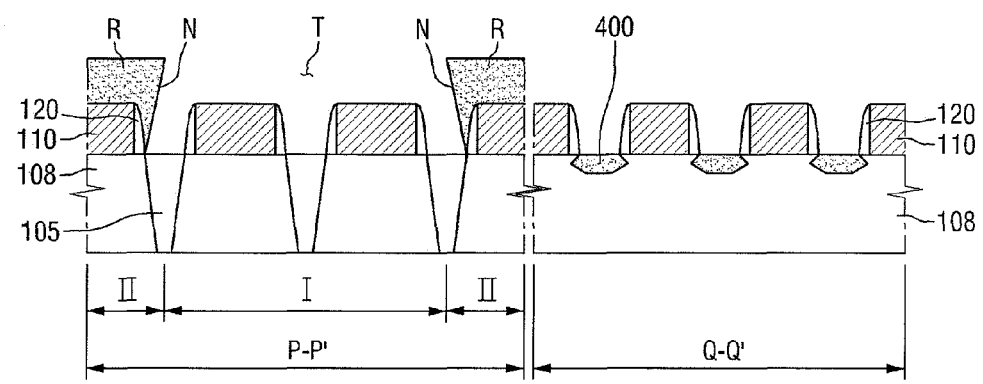

Specifically, referring to FIG. 9, when a PMOS element is to be formed on the first region I of the substrate 100, a SiGe epitaxial layer 400 may be formed in each of the sigma trenches 140 (see FIG. 8) in order to apply compressive stress to a channel region.

The advantages of the present invention will now be described with reference to FIG. 10.

Figure 10:
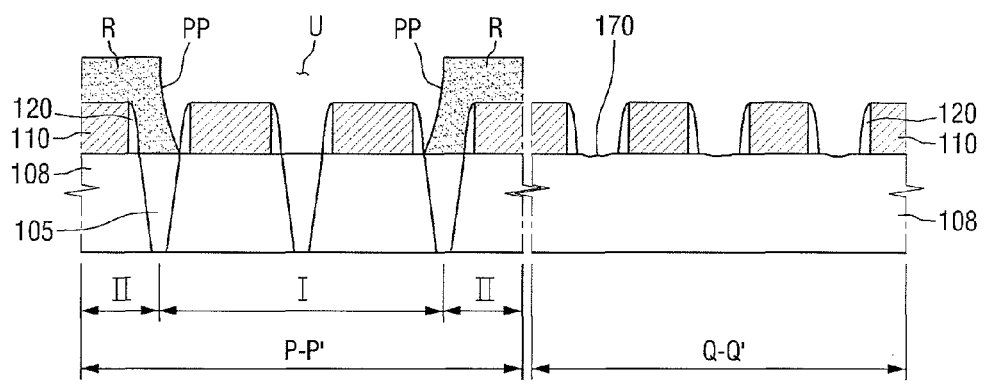
FIG. 10 is a schematic illustration of a comparable semiconductor device, but one which is not fabricated according to embodiments of the present invention.

FIG. 10 illustrates a comparable semiconductor device, but one which is not fabricated according to embodiments of the present invention.

A mask film illustrated in FIG. 10 has a positive lateral profile PP at a boundary between a first region I and a second region II of a substrate 100, in contrast to the negative lateral profile N (as seen in FIGS. 6 to 9) at the boundary between the first and second regions that results from practice of the present invention. That is, unlike in the above-described embodiments of the present invention, the first region I of the substrate 100 is exposed such that a half U-shaped aperture is formed by the mask film (i.e., the remaining resist film region R) whereby the width of the aperture increases as the distance from the substrate 100 increases. By contrast, as seen in FIG. 6, with the present invention the width of the aperture decreases as the distance from substrate 100 increases. In other words, with the semiconductor device of FIG. 10, the boundary between the first region I and the second region II of the substrate 100 is covered by the mask film (i.e., the remaining resist film region R).

But, when the mask film (i.e., the remaining resist film region R) covers the boundary between the first region I and the second region II of the substrate 100 as in FIG. 10, it may be difficult or impossible to form ball trenches 130 (as shown in FIG. 7 for the present invention) and sigma trenches 140 (as shown in FIG. 8 for the present invention) using the mask film and gate electrodes 110 as a mask. This is because it is difficult for an etchant to permeate into a surface of the active region 108 of the substrate 100 if part of the mask film (i.e., the remaining resist film region R) covers part of the surface of the active region 108. Therefore, if the incompletely exposed surface of the active region 108 of the substrate 100 as shown in FIG. 10 is etched, ball trenches 130 (see FIG. 7) and sigma trenches 140 (see FIG. 8) may not be formed normally. Instead, only part of the substrate 100 seen in FIG. 10 may be etched (as indicated by reference numeral 170 in FIG. 10), or no trenches at all may be formed.

This problem occurs more frequently as the element size of a semiconductor device is reduced. This is because a smaller element size reduces a width of a region to be exposed (e.g., a width of the first region I of the substrate 100). This problem is addressed by embodiments of the present invention.

As described above, in the embodiments of the present invention, to expose the first region I of the substrate 100, a negative developing solution is used for a positive resist film. Accordingly, a mask film is formed that has a negative lateral profile at the boundary between the first region I and the second region II of the substrate 100. Therefore, a trench for forming a stress layer can be formed in a reliable manner, which, in turn, makes it possible to form a reliable stress layer.

In concluding the detailed description, those skilled in the art will appreciate that many variations and modifications can be made to the preferred embodiments without substantially departing from the principles of the present invention. Therefore, the disclosed embodiments of the invention are intended to be used in a generic and descriptive sense only and not for purposes of limiting the scope of this invention.

What is claimed is:

1. A method of fabricating a semiconductor device, the method comprising:

providing a substrate which comprises a first region, a second region and a plurality of gate electrodes which are formed on the first and second regions of the substrate;

forming a mask film to expose the first region of the substrate while covering the second region of the substrate, the mask film having a negative lateral profile at a boundary between the first and second regions of the substrate;

forming sigma trenches in the first region of the substrate between gate electrodes by etching the first region of the substrate using the mask film and the gate electrodes as a mask; and forming an epitaxial layer in each of the sigma trenches;

wherein the steps of forming the sigma trenches in the first region of the substrate by etching the first region of the substrate using the mask film and the gate electrodes as the mask comprise:

forming ball trenches in the first region of the substrate by performing a first etching process on the first region of the substrate using the mask film and the gate electrodes as a mask; and, forming the sigma trenches by performing a second etching process on the ball trenches.

2. The method of claim 1, wherein the first etching process comprises a dry etching process, and the second etching process comprises a wet etching process.

3. The method of claim 1, wherein the first region comprises a PMOS region, and the second region comprises an NMOS region.

4. A method of fabricating a semiconductor device, the method comprising:

providing a substrate which comprises a first region, a second region and a plurality of gate electrodes which are formed on the first and second regions of the substrate;

forming a mask film to expose the first region of the substrate while covering the second region of the substrate, the mask film having a negative lateral profile at a boundary between the first and second regions of the substrate;

forming sigma trenches in the first region of the substrate between gate electrodes by etching the first region of the substrate using the mask film and the gate electrodes as a mask; and forming an epitaxial layer in each of the sigma trenches, wherein the steps of forming the mask film comprise:

forming a resist film on the first and second regions of the substrate; irradiating light to the resist film formed on the second region of the substrate while shielding the first region from the light exposure; and applying a developing solution to the resist film, wherein the developing solution comprises at least one member selected from a ketone-based solvent, an ester-based solvent, an alcohol-based solvent, an amide-based solvent, and an ether-based solvent.

5. The method of claim 4, wherein the resist film comprises a resist composition containing a polymer A and a compound B, wherein: the polymer A comprises a first repeating unit a represented by formula (I-a) or formula (I-b) below and a second repeating unit b represented by formula (II) below, but which does not comprise a repeating unit which contains an alcoholic hydroxyl group; and, the compound B is represented by formula (III-a) or formula (III-b) below:

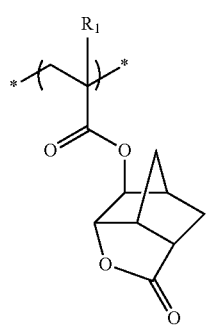
(I-a)

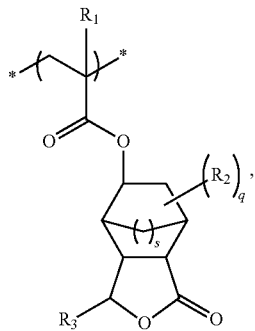
(I-b)

where $R_1$ is a hydrogen atom or an alkyl group with 1 to 10 carbons; $R_2$ is independently selected from an alkyl group with 1 to 10 carbons when q is 2 or more; $R_3$ is a hydrogen atom or an alkyl group with 1 to 10 carbons; q is an integer of 0 to 3; and s is an integer of 1 to 3;

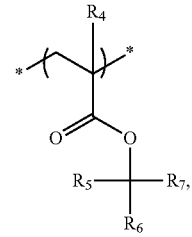
(II)

where $R_4$ is a hydrogen atom or an alkyl group with 1 to 10 carbons; each of $R_5$, $R_6$ and $R_7$ is independently selected from an alkyl group with 1 to 10 carbons or a monocyclic cycloalkyl group with 6 to 20 carbons, and two of $R_5$, $R_6$ and $R_7$ may combine to form a monocyclic ring; and

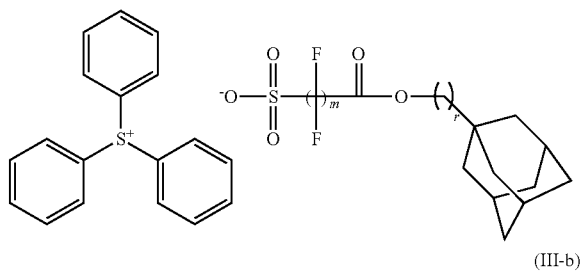
(III-a)

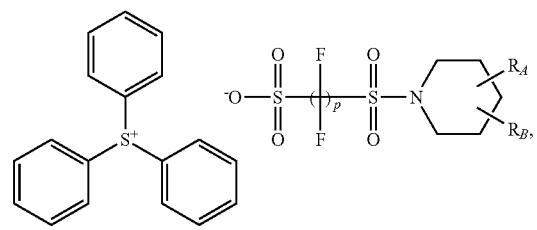
(III-b)

where m is an integer of 1 to 5; r is an integer of 0 to 3; each of $R_A$ and $R_B$ is independently selected from an alkyl group with 1 to 10 carbons; $R_A$ and $R_B$ may combine to form a ring; and P is an integer of 1 to 5.

6. The method of claim 5, wherein the polymer A further comprises a third repeating unit c which is different from the second repeating unit b and has a functional group that can be decomposed by the action of an acid.

7. The method of claim 6, wherein the third repeating unit c is represented by formula (IV) below:

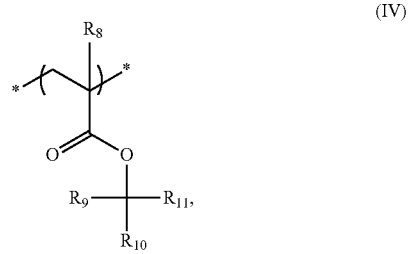
(IV)

where $R_8$ is a hydrogen atom or an alkyl group with 1 to 10 carbons; each of $R_9$, $R_{10}$ and $R_{11}$ is independently selected from an alkyl group with 1 to 10 carbons or a cycloalkyl group with 3 to 15 carbons; at least one of $R_9$, $R_{10}$ and $R_{11}$ is a polycyclic cycloalkyl group, and two of $R_9$, $R_{10}$ and $R_{11}$ may combine to form a polycyclic hydrocarbon structure.

8. The method of claim 7, wherein the polymer A comprises about 30 to 55 mole % of the first repeating unit a, 30 to 65 mole % of the second repeating unit b, and 5 to 30 mole % of the third repeating unit c.

9. The method of claim 5, wherein a number average molecular weight of the polymer A is about 5000 to 30000.

10. The method of claim 3, wherein the resist film further comprises a compound that can generate a compound of formula (I) below when exposed to actinic rays or radiation:

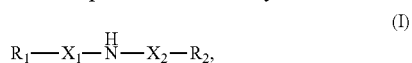
(I)

where each of $R_1$ and $R_2$ is independently selected from a monovalent organic functional group, at least one of $R_1$ and $R_2$ is a proton acceptor functional group, or $R_1$ and $R_2$ may combine to form a ring, the ring may have a proton acceptor functional group, and each of $X_1$ and $X_2$ is independently selected from —CO— or —SO$_2$—.

11. The method of claim 4, further comprising the step of cleaning the substrate using a cleaning solution which comprises a different composition from the developing solution, after the step of applying the developing solution to the resist film.

12. The method of claim 11, wherein the cleaning solution comprises at least one member selected from a hydrocarbon-based solvent, a ketone-based solvent, an ester-based solvent, an alcohol-based solvent, and an ether-based solvent.

13. A method of fabricating a semiconductor device, the method comprising:
providing a substrate which comprises a first region, a second region and a plurality of gate electrodes which are formed on the first and second regions of the substrate;
forming a positive resist film on the first and second regions of the substrate;
irradiating light only to the portion of the positive resist film formed on the second region of the substrate;
exposing the first region of the substrate by applying a negative developing solution to the positive resist film;
forming sigma trenches in the first region of the substrate by etching the first region of the substrate using the positive resist film and the gate electrodes as a mask; and
forming an epitaxial layer in each of the sigma trenches.

14. The method of claim 13, wherein the resist film comprises a resist composition containing a polymer A and a compound B, wherein: the polymer A comprises a first repeating unit a represented by formula (I-a) or formula (I-b) below and a second repeating unit b represented by formula (II) below, but which does not comprise a repeating unit which contains an alcoholic hydroxyl group; and, the compound B is represented by formula (III-a) or formula (III-b) below:

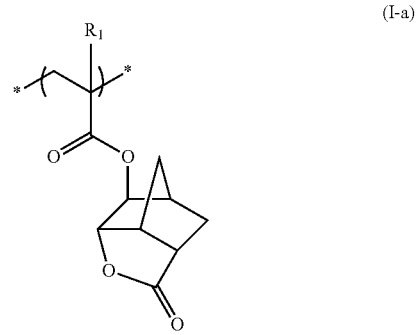
(I-a)

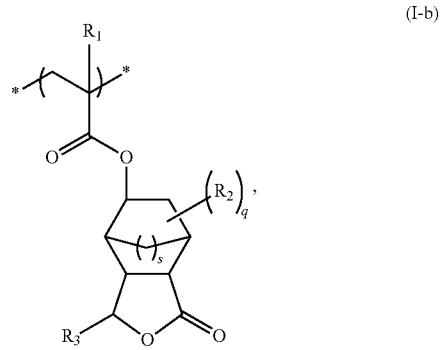
(I-b)

where $R_1$ is a hydrogen atom or an alkyl group with 1 to 10 carbons; $R_2$ is independently selected from an alkyl group with 1 to 10 carbons when q is 2 or more; $R_3$ is a hydrogen atom or an alkyl group with 1 to 10 carbons; q is an integer of 0 to 3; and s is an integer of 1 to 3;

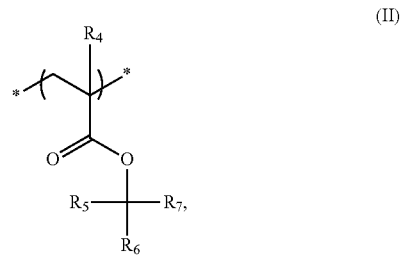
(II)

where $R_4$ is a hydrogen atom or an alkyl group with 1 to 10 carbons; each of $R_5$, $R_6$ and $R_7$ is independently selected from an alkyl group with 1 to 10 carbons or a monocyclic cycloalkyl group with 6 to 20 carbons, and two of $R_5$, $R_6$ and $R_7$ may combine to form a monocyclic ring; and

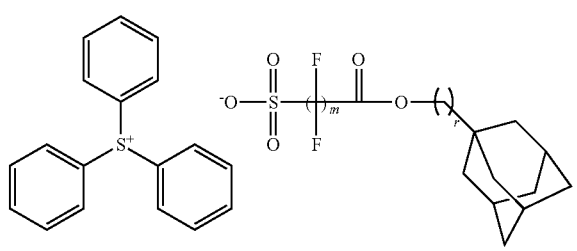
(III-a)

-continued (III-b)

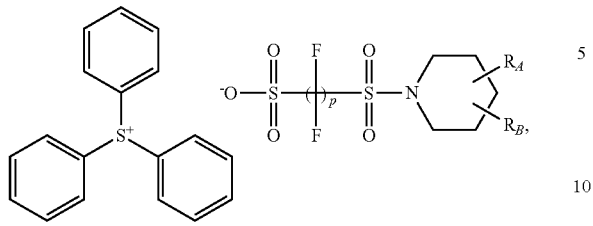

where m is an integer of 1 to 5; r is an integer of 0 to 3; each of $R_A$ and $R_B$ is independently selected from an alkyl group with 1 to 10 carbons; $R_A$ and $R_B$ may combine to form a ring; and P is an integer of 1 to 5.

15. The method of claim 14, wherein the polymer A further comprises a third repeating unit c which is different from the second repeating unit b and has a functional group that can be decomposed by the action of an acid.

16. The method of claim 13, wherein the first region comprises a PMOS region, and the second region comprises an NMOS region.

* * * * *